US010972821B2

(12) United States Patent
Meisel et al.

(10) Patent No.: US 10,972,821 B2
(45) Date of Patent: *Apr. 6, 2021

(54) MEMS MICROPHONE SYSTEM WITH LOW PRESSURE GAP AND BACK VOLUME

(71) Applicants: Akustica, Inc., Pittsburgh, PA (US); Robert Bosch GmbH, Stuttgart (DE)

(72) Inventors: Daniel Meisel, Pittsburgh, PA (US); Andrew Doller, Sharpsburg, PA (US)

(73) Assignee: Robert Bosch LLC, Farmington Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,728

(22) Filed: Oct. 14, 2019

(65) Prior Publication Data

US 2020/0112779 A1  Apr. 9, 2020

Related U.S. Application Data

(63) Continuation of application No. 15/890,941, filed on Feb. 7, 2018, now Pat. No. 10,448,132.

(60) Provisional application No. 62/526,154, filed on Jun. 28, 2017.

(51) Int. Cl.
*H04R 1/04* (2006.01)
*B81B 7/00* (2006.01)
*B81B 7/02* (2006.01)

(52) U.S. Cl.
CPC .............. *H04R 1/04* (2013.01); *B81B 7/0058* (2013.01); *B81B 7/0061* (2013.01); *B81B 7/02* (2013.01); *B81B 2201/0257* (2013.01); *B81B 2203/0127* (2013.01); *B81B 2203/0163* (2013.01); *B81B 2203/04* (2013.01); *H04R 2201/003* (2013.01)

(58) Field of Classification Search
CPC ....... B81B 7/02; B81B 7/0058; B81B 7/0061; B81B 2201/0257; B81B 2201/003; B81B 2203/0127; B81B 2203/0163; B81B 2203/04; H04R 1/04; H04R 2201/003
See application file for complete search history.

(56) References Cited

U.S. PATENT DOCUMENTS

| 9,479,875 | B2 * | 10/2016 | Hall | H04R 23/02 |
| 9,994,440 | B2 * | 6/2018 | Jenkins | B81B 3/0072 |
| 2017/0026729 | A1 * | 1/2017 | Albers | H01L 24/00 |
| 2018/0058915 | A1 * | 3/2018 | Mogelin | H04R 19/005 |

* cited by examiner

*Primary Examiner* — Brian Ensey
(74) *Attorney, Agent, or Firm* — Maginot, Moore & Beck LLP

(57) ABSTRACT

A MEMS microphone system comprises a transducer die having a pierce-less diaphragm and a motion sensor suspended from the diaphragm. The system further comprises a housing and the diaphragm divided a volume inside the housing into a front volume and a back volume. The motion sensor suspended from the diaphragm is located in the back volume having a gas pressure that is substantially equal or lower than an ambient pressure.

9 Claims, 9 Drawing Sheets

MEMS MICROPHONE SYSTEM WITH LOW PRESSURE GAP AND BACK VOLUME

CROSS-REFERENCE TO RELATED APPLICATION

This application claims priority to U.S. patent application Ser. No. 15/890,941 which was filed Feb. 7, 2018, which issued as U.S. Pat. No. 10,448,132 on Oct. 15, 2019, and which in turn claims priority to U.S. provisional patent application Ser. No. 62/526,154, filed Jun. 28, 2017, the contents of which are each incorporated herein by reference as if fully enclosed herein.

FIELD

This disclosure relates generally to microelectromechanical system (MEMS) transducers and, more particularly, to a MEMS microphone system with low pressure gap and back volume.

BACKGROUND

Unless otherwise indicated herein, the materials described in this section are not prior art to the claims in this application and are not admitted to the prior art by inclusion in this section.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a MEMS microphone system. The system comprises a transducer die having a pierce-less diaphragm and a motion sensor suspended from the diaphragm. The system further comprises a housing and the diaphragm dividing a volume inside the housing into a front volume and a back volume. The motion sensor suspended from the diaphragm is located in the back volume having a gas pressure that is substantially equal or lower than an ambient pressure.

In another aspect of the disclosure, a MEMS microphone system comprises a microphone housing and a cavity formed within the microphone housing. A pierce-less diaphragm dividing the cavity into a front volume and a back volume. An electrode assembly is suspended from the diaphragm and is located in the back volume. The electrode assembly comprises a first electrode and a second electrode spaced apart from the first electrode. Each electrode comprises a first support post and a second support post configured to suspend the electrode assembly from the diaphragm. A gap formed between the first electrode and the second electrode includes a gas pressure that is substantially equal or lower than an ambient pressure.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The disclosure is a microphone system for a client machine. Within the client machine are several other electronic components, such as transducer dies, speakers, graphical processor units, computer processor units, host systems, MEMS microphones, and any suitable computer implemented devices either directly or indirectly coupled to the microphone system. The client machine may be a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or infotainment remote control, a thin client system, a thick client system, or the like. Other suitable client machines regardless of size, mobility, or configuration may be suggested to include any number of microphone system.

The microphone system includes a package housing or an enclosure for housing any number of transducer dies, internal components, or combination thereof. The transducer dies may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, graphene microphones, piezoelectric microphones, silicon microphones, optical microphones, or any suitable acoustic microphones.

Figure 1:
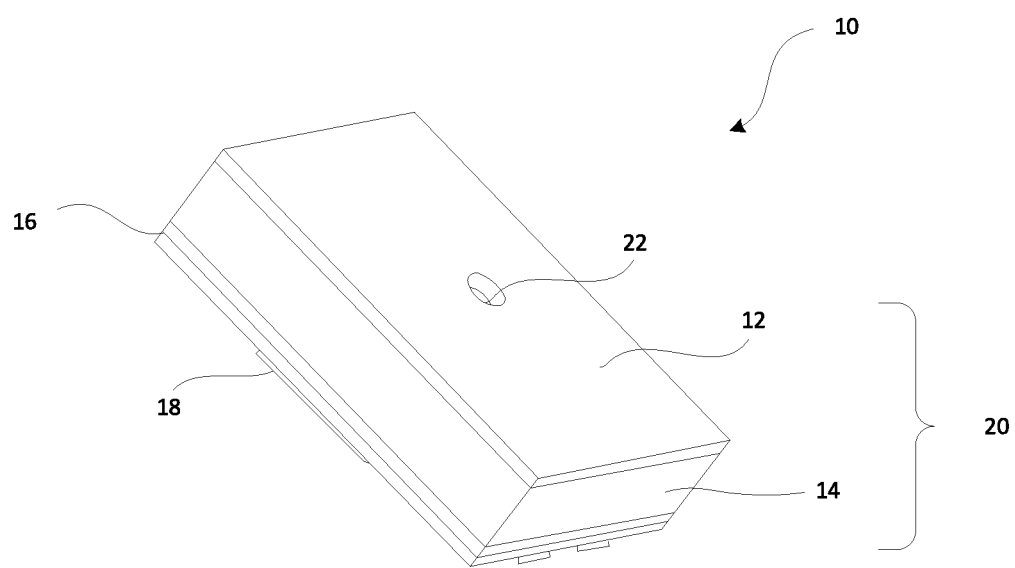
FIG. 1 is a perspective view of a microphone system in accordance with a described embodiments of a disclosure.

FIG. 1 is a perspective view of a microphone system 10 according to an embodiment of the disclosure. The MEMS microphone system 10 includes a package housing 20 having a lid 12, a spacer 14, and a substrate 16 attached to the spacer 14 by any suitable methods of attachment. More than one transducer die may be mounted within the microphone system 10. The transducer dies may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. Optional components such as ASICs, integrated circuits, processors, controllers, energy storage devices, actuators, sensor circuits or any suitable circuitry may be mounted within the microphone system 10. Depending on the application, any number of opening 22 such as a port or a passageway for receiving attributes from an environment may be formed on any location of the package housing 20 by etching, piercing, drilling, punching, or any suitable methods. For example, the opening 22 may be formed on the lid 12, the substrate 16, or the spacer 14. In some embodiments, the opening 22 may be formed on multiple locations of the package housing 20. The attributes may be acoustic signal, pressure signal, optical signal, gas signal, and any suitable signal. An optional barrier may be formed within the opening 22. The barrier is configured and functioned as a filter to remove debris, contamination, particles, vapor, fluid, or the like. In some embodiments, the barrier may formed on the outer surface of the housing 20 to cover the opening 22 so that debris, contamination, particles, or the like cannot penetrate into the housing. In yet another embodiments, the barrier may be formed below the opening 22 in which a portion of the barrier is attached to the inner surface of the housing 20 for filtering or removing debris, contamination, particles, or the like. In yet embodiments, the barrier may be fabricated directly onto the movable member such as a diaphragm. In yet another embodiment, the barrier is formed as a layered film or a layered material and may either be integrated into the housing 20 during fabrication, or disposed on the outer or inner surface of the housing 20. Although one barrier is described, multiple layers of barrier or any suitable number of barrier may be implemented on the MEMS package, depending on the application. The barrier not only functions as the particle removal while exposed to the environment via the opening 22, the barrier can also serve other purposes such as a shock absorber, or a vibration damper, or combination thereof. Although the microphone system 10 as depicted comprises a multi-structure package housing 20, various aspects and configurations either in a single structure package housing, a two piece structure package housing, or multi-structure package housing may be used to encapsulate at least one internal component. As an example, the lid 12 and the spacer 14 may be formed as a single structure, defines a cover or a cap. One or more bonding pads 18 may be formed on the substrate 16, the lid 12, the spacer 14, or multiple locations of the package housing 20 by any suitable method. Once bonding pads 18 are introduced, the microphone system 10 can be easily mounted to an external printed circuit board or another support member of the client machine. In some embodiments, the package housing further includes an interposer coupled the cover 12 to either the spacer 14 or the substrate 16.

Figure 2A:
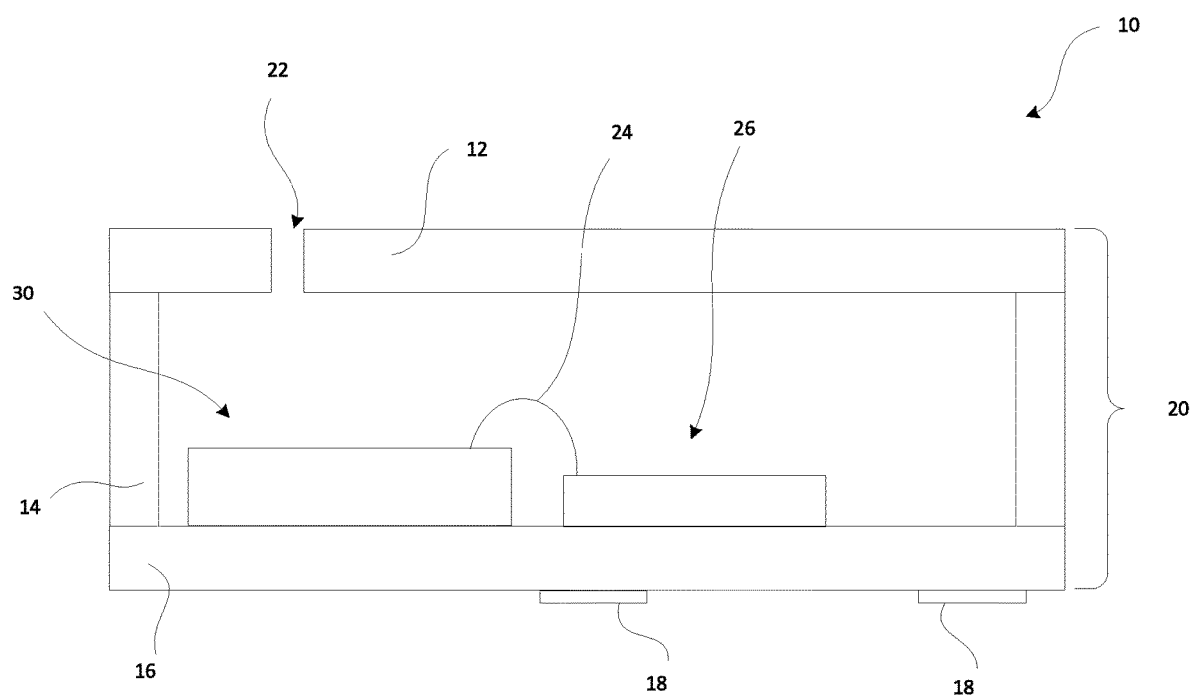
FIG. 2A is a cross-sectional view of the microphone system of FIG. 1 in accordance with a described embodiment of the disclosure.
Figure 2B:
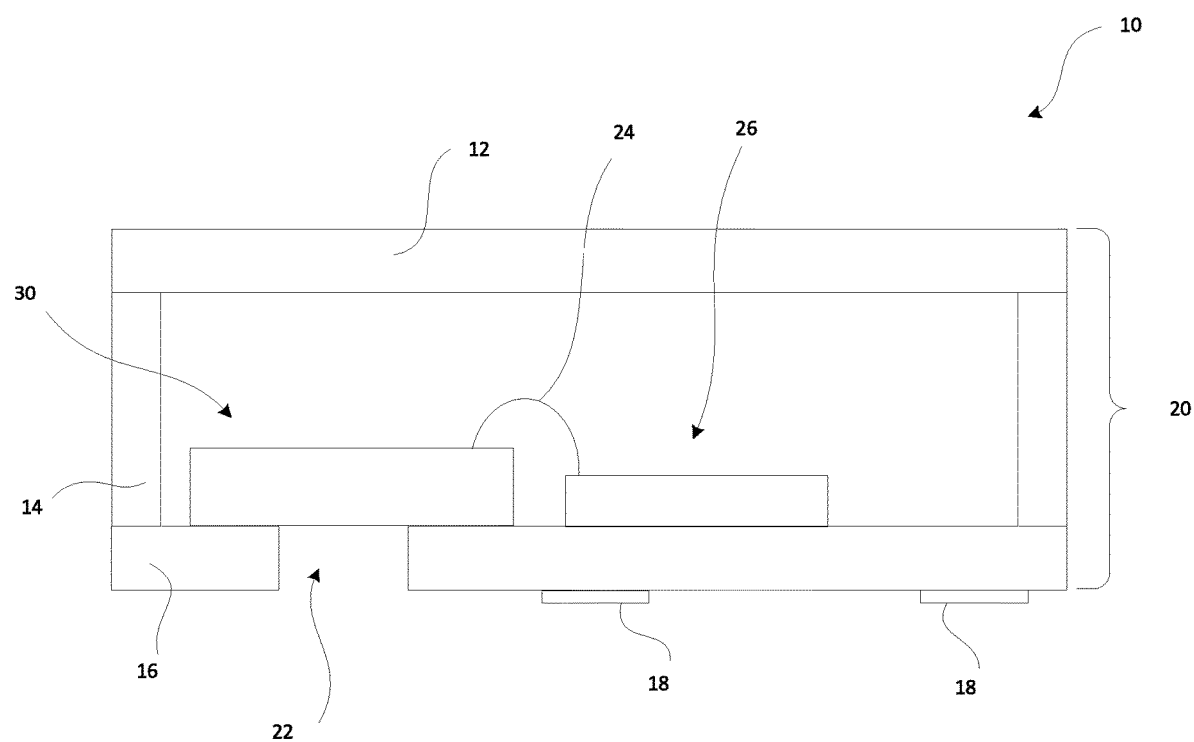
FIG. 2B is a cross-sectional view of another microphone system of FIG. 1 with a bottom port in accordance with a described embodiment of the disclosure.
Figure 2C:
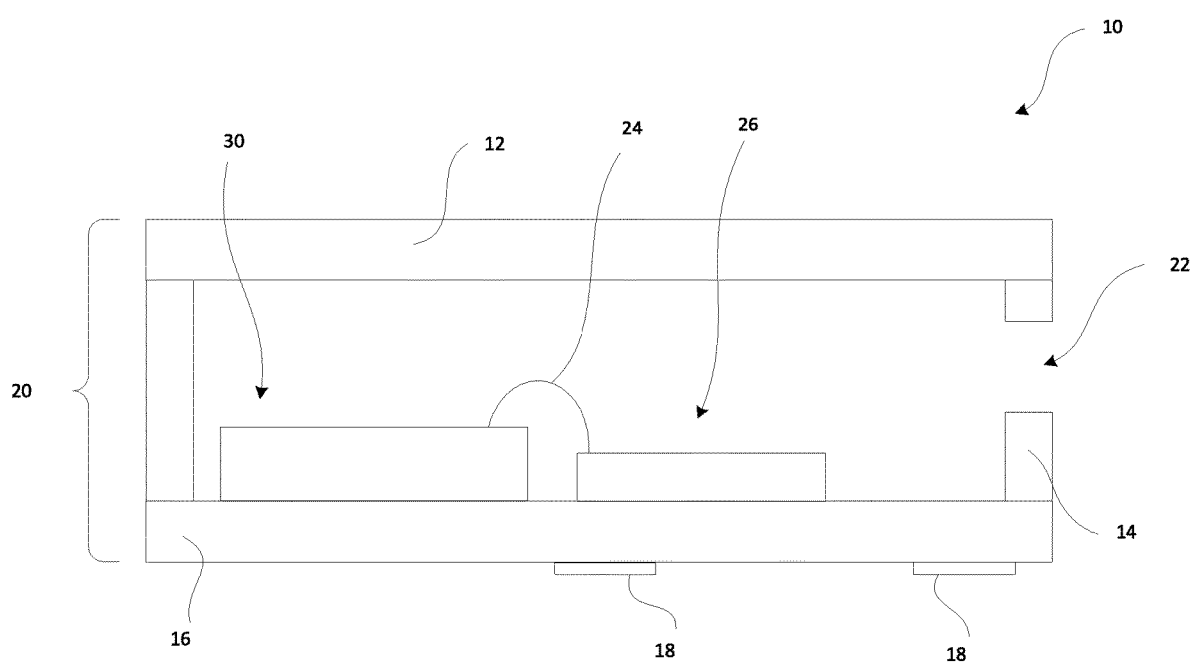
FIG. 2C is a cross-sectional view of another microphone system of FIG. 1 with a side port in accordance with a described embodiment of the disclosure.

FIGS. 2A-2C illustrate cross-sectional view of the microphone systems 10 of FIG. 1 having at least one opening 22 formed on various location of the packaging housing 20 in accordance with a described embodiment of the disclosure. The microphone system 10 includes a transducer die 30 and a component 26 mounted within any location of the package housing 20. An opening 22 formed on any location of the package housing 20 is adjacent to at least one of the transducer die 30 or the component 26 is provided to receive attributes or stimuli from external environment. A connection link 24 may be introduced to communicatively couple the transducer die 30 to the component 26. The connection link 24 may be wire bonding, solder-bump, solder microbump, solder ball, or any suitable connectors. In some embodiments, the connection link 24 may be a wireless communication link and the transducer die 30 is communicatively coupled to the component 26 with built-in interfaces formed in both transducer die 30 and the component 26. The wireless communicative link, for example, may be WiFi, near field communication (NFC), Zigbee, Smart WiFi, Bluetooth (BT) Qi wireless communication, ultra-wide band (UWB), cellular protocol frequency, radio frequency, or any suitable communication link. Depending on the applications, any number of transducer die 30, components 26, or connection links 24 between the transducer dies and the components may be used. Although side-by-side configuration of the component 26 and the transducer die 30 is illustrated in FIG. 1, any suitable configurations may be possible. For example, the transducer die 30 may be placed or mounted on top of the component 26 to form a stacked configuration. In another example, the transducer die 30 may be mounted in a hole formed within the component 26 configured to receive the transducer die to form a surrounded configuration.

Figure 3:
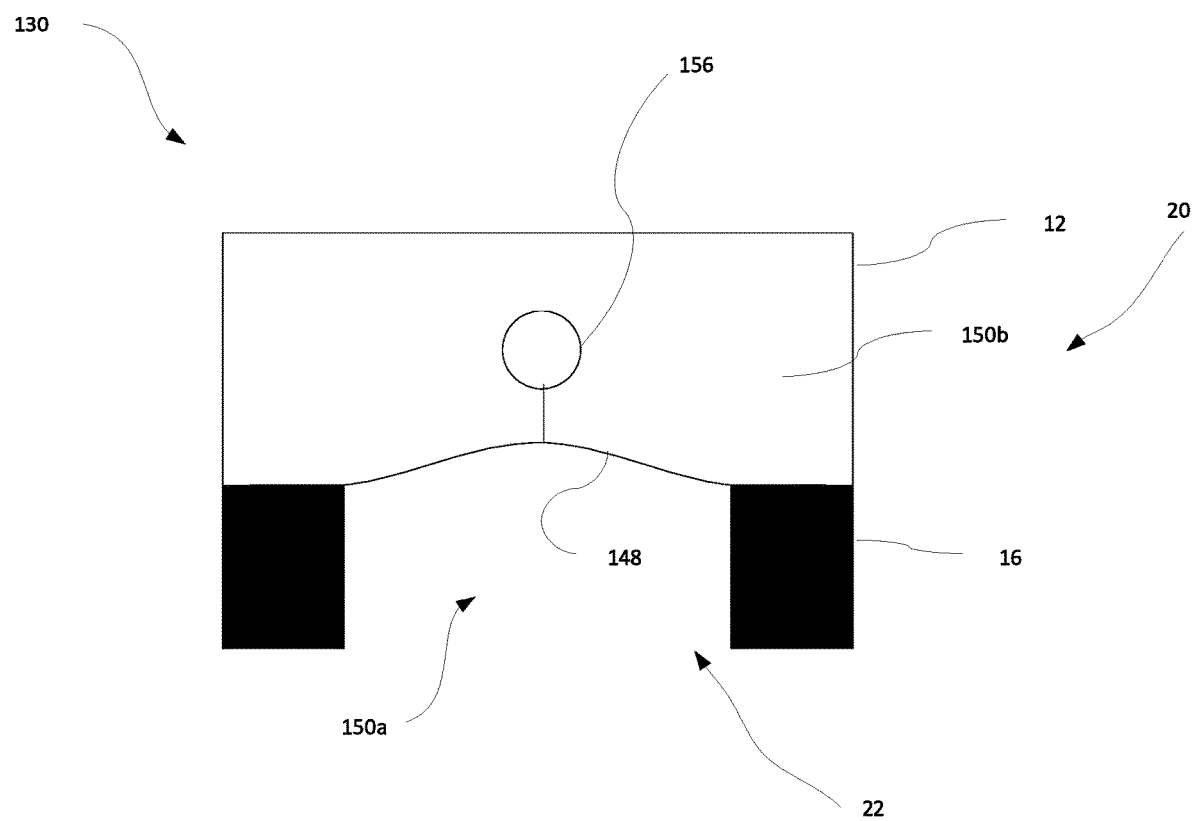
FIG. 3 is a cross-sectional view of a microphone system having a MEMS microphone die in accordance with a described embodiment of the disclosure.

FIG. 3 illustrates a cross-sectional view of a MEMS microphone die 130 in accordance with an exemplary embodiment of the disclosure. Inside a microphone housing 20 of the microphone die 130 comprises a volume that is divided into a front volume 150a and a back volume 150b by a diaphragm 148. A motion sensor 156 located in the back volume 150b is suspended from the diaphragm 148. The microphone die 130 further comprises an opening 22 in fluid communication with the front volume 150a. As illustrated, the opening 22 is formed on a substrate 16 by any suitable methods. Although one opening 22 is depicted, several smaller holes formed in a group, as opposed to a single large hole, can be pierced in the substrate 16 for receiving sound pressure. In operation, sound pressure travels into the front volume 150a through the opening 22. The acoustic pressure in the front volume 150a causes the diaphragm 148 to vibrate. The motion sensor 156 detects the frequency and amplitude of the diaphragm motion and converts both the frequency and the amplitude into an electrical signal for further processing. Static ambient pressure deforms the diaphragm 148 statically. If the ambient pressure changes slowly, the diaphragm 148 deforms gradually and slowly over a period of time. In one embodiment, the motion sensor is a capacitive or piezoelectric or piezoresistive or other using another transducer mechanism non-DC capable acceleration sensor that coupled to the diaphragm 148 move upon the motion of the diaphragm. In another embodiment, the motion sensor is a one-channel, two-channel or three-channel acceleration sensor where the DC component is canceled by signal processing or by other means. Other types of sensor such as a pure dynamic motion sensor, a velocity sensor, a rotational-rate sensor, a rotational accelerator sensor, a laser-doppler, an interferometer, an optical sensor, a light sensor, a magnetic sensor, or any suitable sensors may be used without departing from the scope of the disclosure. In some embodiments, the sensor 156 may be mounted to any structure of the microphone die 130 other than to the diaphragm as previously described. For example, the sensor 156 may be mounted to any inner wall of the housing 20. Although one sensor 156 is illustrated, the microphone die 130 may include two or more sensors 156 for measuring the motion of the diaphragm due to the sound pressure.

With the pierce-less diaphragm 148 inside the microphone housing 20, the back volume 150b is completely sealed, and barometric pressure changes would cause a significant displacement of the diaphragm 148. Since there is no holes in the diaphragm 148 the pressure within the back volume 150b is sealed and evacuated. Gas from external environment is prevented from reaching the back volume 150b. The gas pressure or the gas viscosity or heat conductivity inside the back volume 150b is therefore significantly reduced. Likewise, acoustic noise or thermomechanical noise as a result of the reduction of the gas pressure also is reduced. Thus, the signal-to-noised (SNR) ratio and particle robustness of the microphone die 130 are improved.

Figure 4A:
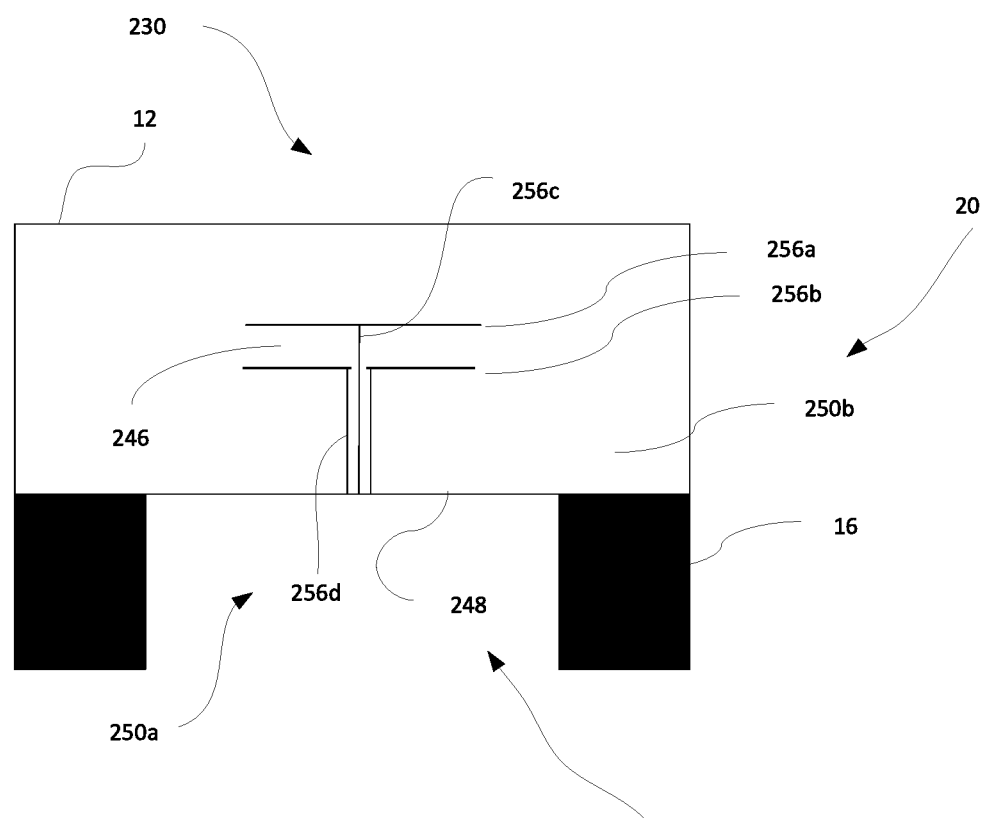
FIGS. 4A-4E are cross-sectional views of a microphone system having a MEMS microphone die in accordance with another described embodiment of the disclosure.
Figure 4B:
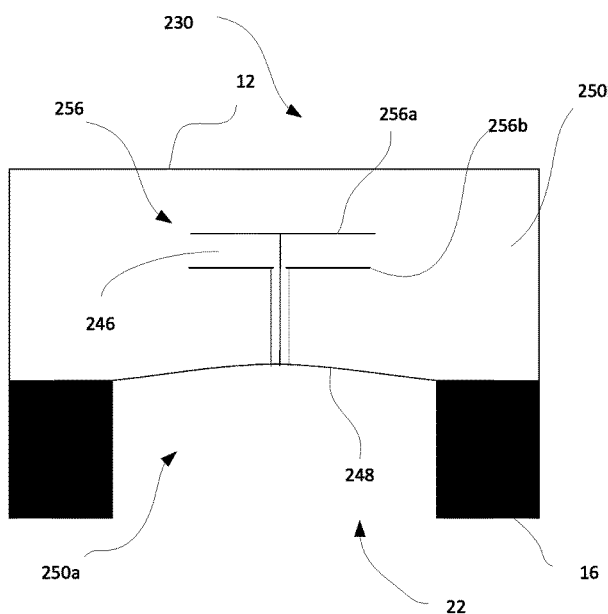
Figure 4C:
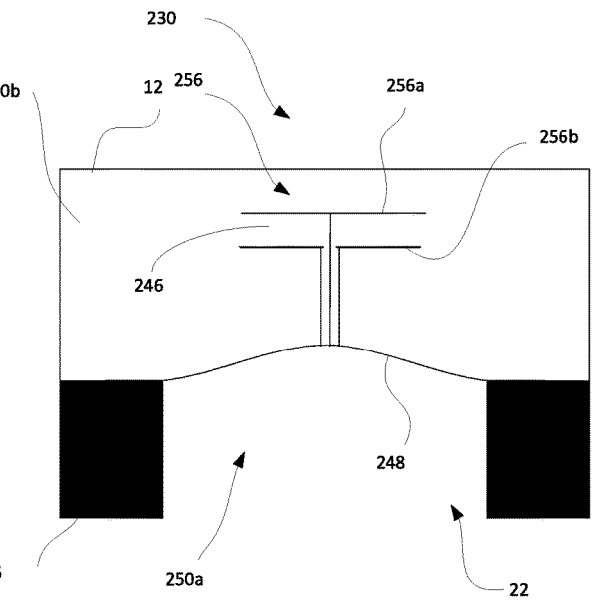
Figures 4D, 4E:
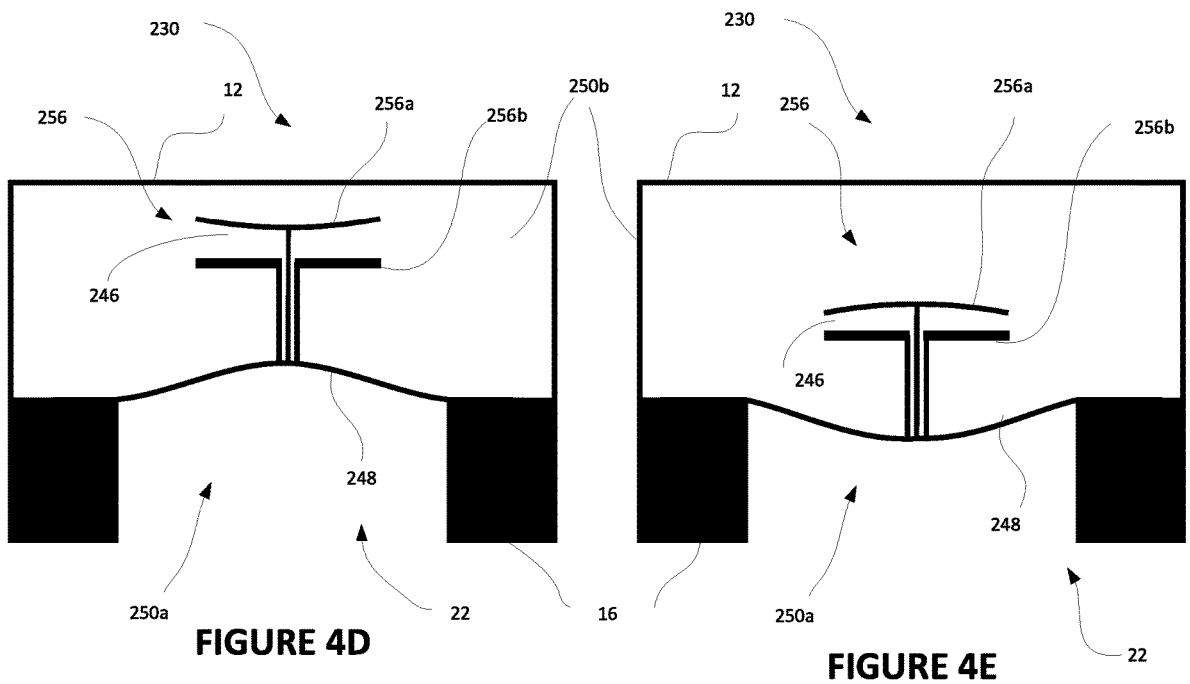

FIGS. 4A-4E illustrate cross-sectional views of a microphone die 230 in accordance with an exemplary embodiment of the disclosure. Unlike from the microphone die 130 of FIG. 3, the microphone die 230 comprises an electrode assembly 256 suspended from a diaphragm 248. The electrode assembly 256 comprises a first electrode 256a, a second electrode 256b, and a gap 246 formed between the first and second electrodes 256a, 256b. As illustrated, the first and second electrode 256a, 256b located in the back volume 250b are parallel to each other. The electrode assembly 256 further comprises a first support member 256c for suspending the first electrode 256a and a second support member 256d for suspending the second electrode 256b. The first support member 256c having a height longer than a height support member 256d in order to form a gap 246 between the first and second electrode 256a, 256b. In one embodiment, the second support member 256d is a tubular shape with a hollow portion for receiving the first support member 256c. In operation, sound pressure acting on the diaphragm 248 results in a vertical movement of the diaphragm 248 with the frequency of the sound and an amplitude according to the sound pressure level. Due to the movement of the base, the first electrode 256a starts to vibrate as well. The second electrode 256b does not flex. The relative motion between the first and second electrode 256a, 256b results in a change of the effective gap 246. The dynamic change of the gap 246 can be read out by an electric circuit and to obtain a value of the sound. As illustrated in FIGS. 4B and 4C, the gap 246 does not change in case of different ambient pressures (barometric pressures) thus making the system insensitive against low-frequency ambient pressure changes. Unlike from FIGS. 4B and 4C, the first electrode 256a and the diaphragm 248 as illustrated in FIGS. 4D and 4E flex freely in any direction. The relative motion between the first and second electrode 256a, 256b results in a change of the effective gap 246. The dynamic change of the gap 246 is read out by an electric circuit and to obtain a value of the sound.

Figure 5A:
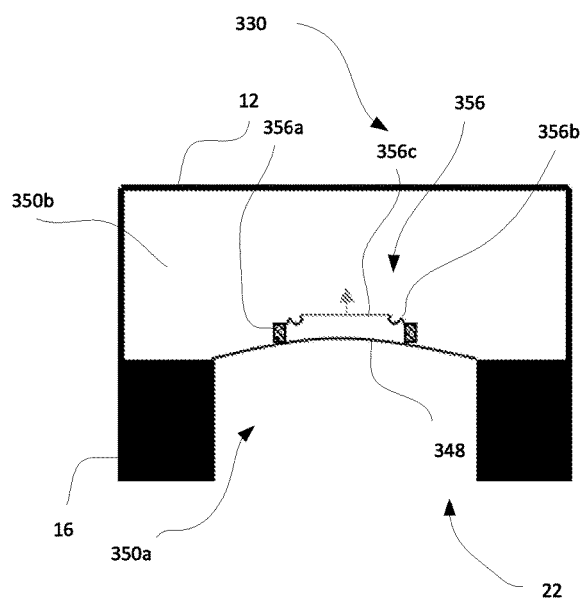
FIGS. 5A and 5B are cross-sectional views of a microphone system having a MEMS microphone die in accordance with another described embodiment of the disclosure.
Figure 5B:
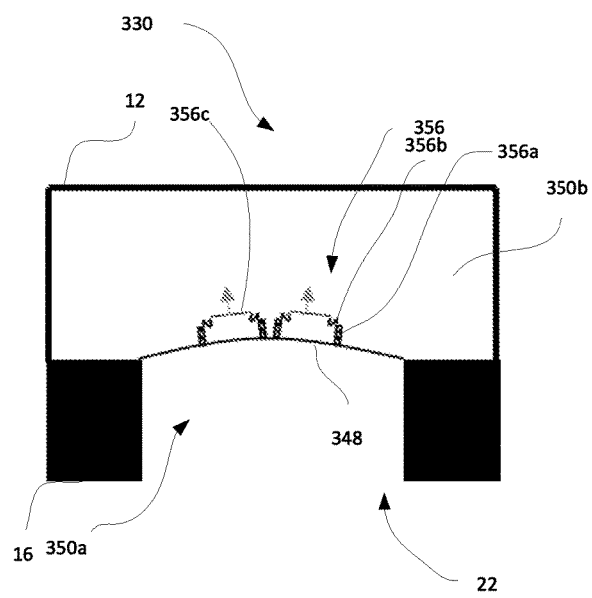

FIGS. 5A and 5B illustrate cross-sectional views of a microphone die 330 in accordance with an exemplary embodiment of the disclosure. Unlike from the microphone die 230 of FIG. 4, the microphone die 330 comprises one or more sensors 356 suspended from a diaphragm 348. The sensor 356 such as a sensing electrode may be made from the diaphragm 348. Using a conductive layer, the sensor 356 could be applied or suspended from the diaphragm 348 via insulators 356a. The sensor 356 comprises an electrode 356c having a spring element 356b suspended on the insulator 356a. Electrical connections to the diaphragm 348 and the sensor 356 may be provided via the insulators 356a. The electrode 356c flex outwardly in the direction as depicted in arrow and move away and then flex inwardly towards the diaphragm 348 thereby changing the gap between 356c and 348. The phase relation between the motion of the diaphragm 348 and the sensor 356 can range between 0 degree and 360 degree; in some embodiments. The change in gap can result in a change in capacitance by using 348 as a counter electrode. This change in capacitance can be evaluated by coupling the microphone die 330 to an electric circuit for detecting sound.

In another embodiment, rotational rate sensors or rotational acceleration sensors can be attached to the diaphragm. The location is preferably between the center of the membrane and the edge, more preferably at the point where the rotational rate or change in rotational rate is the largest.

In another embodiment, a Doppler-effect can be used to read out the motion of the diaphragm. Optionally, a light source and a light detector are attached to the lid. The diaphragm serves as a mirror and a reference beam and a light beam reflected from the diaphragm are brought into interference on the light detector. Upon vibration of the diaphragm, the light intensity on the detector changes accordingly. An electric circuit coupled to the microphone die is used to read out the electric signal.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A microphone system comprising:
   a housing;
   a volume formed within the housing;
   a movable member dividing the volume into a front volume and a back volume; and
   a first sensor located in the back volume, the first sensor supported on the movable member and configured to detect frequency and amplitude of the movable member in motion and convert both the frequency and the amplitude into an electrical signal for further processing, wherein the first sensor is an electrode assembly, the electrode assembly comprising:
   a first electrode supported by a first support member;

a second electrode supported by a second support member; and a first gap formed between the first and second electrodes; wherein the first and second electrodes are parallel to each other, and the first and second support members couple the first and second electrodes to the movable member.

2. The microphone system of claim 1 wherein the movable member is a pierce-less diaphragm.

3. The microphone system of claim 1 wherein the first support member has a length different from a length of the second support member.

4. The microphone system of claim 3 wherein the second support member comprises a tubular shape body with a hollow portion for receiving the first support member.

5. The microphone system of claim 1 wherein the microphone system further comprises a second sensor suspended from the movable diaphragm, each of the first and second sensors comprising:

an electrode having a spring element; and an insulator configured to support the electrode.

6. The microphone system of claim 5 wherein the first sensor is selected from a group consisting of a motion sensor, a capacitive transducer, a piezoelectric transducer, a piezoresistive transducer, a one-channel acceleration sensor, a two-channel acceleration sensor, a three-channel acceleration sensor, a pure dynamic motion sensor, a velocity sensor, a rotational-rate sensor, a rotational accelerator sensor, a laser-doppler, an interferometer, an optical sensor, a light sensor, and a magnetic sensor.

7. The microphone system of claim 2 wherein the back volume has a gas pressure that is substantially equal to or lower than an ambient pressure of the microphone system.

8. The microphone system of claim 1, further comprising:

a second gap between the first support member and the second support member.

9. The microphone system of claim 1, wherein:

the first support member supports the first electrode at a first height above the movable member;

the second support member supports the second electrode at a second height above the movable member; and the first height is higher than the second height.

* * * * *